(12) United States Patent
Wang (10) Patent No.: US 12,341,070 B2
(45) Date of Patent: Jun. 24, 2025

(54) APPARATUS MATCH DETECTION METHOD, DETECTION SYSTEM, PREWARNING METHOD, AND PREWARNING SYSTEM

(71) Applicant: CHANGXIN MEMORY TECHNOLOGIES, INC., Hefei (CN)

(72) Inventor: Weigang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 588 days.

(21) Appl. No.: 17/436,802

(22) PCT Filed: Mar. 1, 2021

(86) PCT No.: PCT/CN2021/078509
§ 371 (c)(1),
(2) Date: Jul. 12, 2022

(87) PCT Pub. No.: WO2021/190248
PCT Pub. Date: Sep. 30, 2021

(65) Prior Publication Data
US 2022/0328364 A1    Oct. 13, 2022

(30) Foreign Application Priority Data

Mar. 24, 2020 (CN) .................. 202010215055.X (51) Int. Cl.
*H01J 37/28* (2006.01)
*H01L 21/66* (2006.01)

(52) U.S. Cl.
CPC .............. *H01L 22/12* (2013.01); *H01J 37/28* (2013.01); *H01L 22/20* (2013.01); *H01J 2237/2817* (2013.01); *H01J 2237/2826* (2013.01)

(58) Field of Classification Search
CPC ......... B82Y 35/00; G01B 11/02; G01B 11/24; G01B 11/0683; G01B 15/00;
(Continued)

(56) References Cited

U.S. PATENT DOCUMENTS 6,570,157 B1    5/2003  Singh et al.
9,165,742 B1 *  10/2015  Simmons ................ H01J 37/06
(Continued)

FOREIGN PATENT DOCUMENTS

CN        101634546 A     1/2010
CN        102569258 A     7/2012
(Continued)

OTHER PUBLICATIONS

International Search Report for International Application PCT/CN2021/078509 mailed May 26, 2021.

*Primary Examiner* — Lisa M Caputo
*Assistant Examiner* — Eric Sebastian Von Wald
(74) *Attorney, Agent, or Firm* — Kilpatrick Townsend & Stockton LLP (57) ABSTRACT

Embodiments of the present disclosure provide an apparatus match detection method, a detection system, a prewarning method and a prewarning system, the apparatus match detection method includes: providing a to-be-detected wafer, a first detection apparatus, and a second detection apparatus; measuring by the first detection apparatus a critical dimension of the first detection area to acquire a first detection result; measuring by the second detection apparatus a critical dimension of the third detection area to acquire a third detection result; measuring by the first detection apparatus a critical dimension of the second detection area to acquire a second detection result; acquiring a measurement difference between the first detection apparatus and the second detection apparatus based on the first detection
(Continued)

result, the second detection result, and the third detection result; and acquiring a degree of deviation between the second detection apparatus and the first detection apparatus based on the measurement difference.

10 Claims, 7 Drawing Sheets

(58) Field of Classification Search
CPC ............ G01B 2210/56; G01N 23/225; G01N 23/2251; G01N 21/9501; G01N 21/956; G03F 7/70625; G03F 7/70616; G03F 1/44; G03F 7/7065; G03F 7/706; G03F 7/7085; G03F 9/7003; G06T 2207/30148; G06T 2207/10061; G06T 7/12; G06T 7/13; G06T 7/60; H01J 37/28; H01J 2237/2817; H01J 2237/2826; H01J 2237/24578; H01J 2237/24465; H01J 2237/24495; H01J 2237/24592; H01L 21/67253; H01L 22/26; H01L 22/00; H01L 22/12; H01L 22/20; H01L 22/14; H01L 21/67; H01L 21/67242; H01L 22/30
See application file for complete search history.

(56) References Cited

U.S. PATENT DOCUMENTS

| | | | |
|---|---|---|---|
| 10,359,706 B1* | 7/2019 | Sriraman | G03F 7/70633 |
| 2006/0091309 A1* | 5/2006 | Oosaki | H01J 37/28 |
| | | | 250/310 |
| 2013/0166240 A1* | 6/2013 | Shishido | G01Q 40/00 |
| | | | 702/97 |
| 2013/0188037 A1 | 7/2013 | Fang et al. | |
| 2018/0182089 A1* | 6/2018 | Brill | G01B 11/02 |
| 2020/0211819 A1* | 7/2020 | Dillen | H01J 37/222 |

FOREIGN PATENT DOCUMENTS

| | | |
|---|---|---|
| CN | 104658936 A | 5/2015 |
| CN | 104752251 A | 7/2015 |
| CN | 110823089 A | 2/2020 |

* cited by examiner

APPARATUS MATCH DETECTION METHOD, DETECTION SYSTEM, PREWARNING METHOD, AND PREWARNING SYSTEM

CROSS-REFERENCE TO RELATED APPLICATIONS

The present application is a national stage entry of International Patent Application No. PCT/2021/078509, filed on 1 Mar. 2021, which claims priority to Chinese Patent Application No. 202010215055.X, filed on 24 Mar. 2020, the entire contents of which are incorporated herein by reference.

TECHNICAL FIELD

The present disclosure relates to the field of semiconductor device disclosure technologies, in particular to an apparatus match detection method, a detection system, a prewarning method, and a prewarning system.

BACKGROUND

With continuous reduction in a feature size of a semiconductor integrated circuit device, a critical dimension of a DRAM becomes increasingly small. Therefore, a precision, stability, and reliability of a critical dimension measurement become more important. A deviation exists between measurement results of different scanning electron microscope apparatuses, thereby affecting a precision and stability of a manufacture procedure. Therefore, the deviations between different scanning electron microscope apparatuses are required to be detected during a manufacture procedure, namely detecting a degree of deviation between different scanning electron microscope apparatuses.

However, existing detection methods of detecting the degree of deviation between different scanning electron microscope apparatuses have a hysteresis and a low efficiency, thereby exerting an influence on a manufacture procedure.

SUMMARY

According to embodiments of the present disclosure, there are provided an apparatus match detection method, a detection system, a prewarning method, and a prewarning system, which utilizes a new match and calibration method to acquire a degree of deviation between different line width scanning electron microscope apparatuses, so as to timely find out a measurement difference between various line width scanning electron microscope apparatuses, avoiding a instability of a manufacture procedure caused by the measurement differences of the apparatuses.

In order to solve the technical problem described above, an apparatus match detection method according to an embodiment of the present disclosure is provided, including: providing a to-be-detected wafer, a first detection apparatus, and a second detection apparatus, the to-be-detected wafer including a first target detection area, a second target detection area, and a third target detection area, wherein the first target detection area and the second target detection area are independent of each other, and the third target detection area at least includes the first target detection area and the second target detection area; measuring by the first detection apparatus a critical dimension of the first target detection area to obtain a first detection result; measuring by the second detection apparatus a critical dimension of the third target detection area to obtain a third detection result; measuring by the first detection apparatus a critical dimension of the second target detection area to obtain a second detection result; acquiring a measurement difference between the first detection apparatus and the second detection apparatus based on the first detection result, the second detection result, and the third detection result; and acquiring a degree of deviation between the second detection apparatus and the first detection apparatus based on the measurement difference.

As compared to a calibration manner according to a related art, the present disclosure utilizes a calibration and detection method of ABA, wherein the first A denotes that the first detection apparatus detects the critical dimension of the first target detection area, the first A denotes that the second detection apparatus detects the critical dimension of the third target detection area, B denotes the first target detection apparatus detects the critical dimension of the second target detection area, and the second A denotes the first target detection apparatus detects the critical dimension of the second target detection area, to obtain the degree of deviation between the first detection apparatus and the second detection apparatus. The method has a more efficient detection, and can timely find out a measurement difference between various line width scanning electron microscope apparatuses, avoiding instability of a manufacture procedure caused by the measurement differences of the apparatuses.

In other embodiments, the acquiring a measurement difference between the first detection apparatus and the second detection apparatus based on the first detection result, the second detection result, and the third detection result includes: acquiring the measurement difference based on a preset equation of difference calculation; the preset equation of difference calculation: $\Delta=(A1-2B+A2)/2$, wherein $\Delta$ denotes the measurement difference, A1 denotes the first detection result, B denotes the third detection result, and A2 denotes the second detection result.

In other embodiments, the first target detection area includes M first detection units, the second target detection area includes H second detection units, and the third target detection area includes L third detection units; each of M and H is a natural number greater than 1, and L is a natural number greater than a sum of M and H; the first detection result is a mean value obtained by measuring and averaging the critical dimensions of the M first detection units; the second detection result is a mean value obtained by measuring and averaging the critical dimensions of the H second detection units; the third detection result is a mean value obtained by measuring and averaging the critical dimensions of the L third detection units.

According to an embodiment of the present disclosure, an apparatus match detection system for detecting a degree of deviation between apparatuses is further provided, including: a first acquisition module for acquiring a first detection result, the first detection result being a measurement result of a critical dimension of a first target detection area of a to-be-detected wafer measured by a first detection apparatus; a second acquisition module for acquiring a second detection result, the second detection result being a measurement result of a critical dimension of a second target detection area of the to-be-detected wafer measured by the first detection apparatus; a third acquisition module for acquiring a third detection result, the third detection result being a measurement result of a critical dimension of a third target detection area of the to-be-detected wafer measured by a second detection apparatus; a first processing module connected to a first detection module, a second detection module, and a third detection module, the first processing module acquiring a measurement difference between the first detection apparatus and the second detection apparatus based on the first detection result, the second detection result, and the third detection result; a second processing module connected to the first processing module, the second processing module acquiring a degree of deviation between the second detection apparatus and the first detection apparatus based on the measurement difference.

As compared to a related art, the degree of deviation between the first detection apparatus and the second detection apparatus is obtained by using the more efficient calibration and detection method, and a measurement difference between various line width scanning electron microscope apparatuses are found out timely, avoiding instability of a manufacture procedure caused by the measurement differences of the apparatuses.

According to an embodiment of the present disclosure, a prewarning method of an apparatus is further provided, including: providing a to-be-detected wafer, a first detection apparatus, and a second detection apparatus, the to-be-detected wafer including a first target detection area, a second target detection area, and a third target detection area, wherein the first target detection area and the second target detection area are independent of each other, and the third target detection area at least includes the first target detection area and the second target detection area; and based on the to-be-detected wafer, performing a degree of deviation detection on the first detection apparatus and the second detection apparatus by using the apparatus match detection method above, so as to acquire a degree of deviation between the first detection apparatus and the second detection apparatus; if the degree of deviation is less than a degree of deviation threshold, issuing a prewarning information.

As compared to a related art, the degree of deviation between the first detection apparatus and the second detection apparatus is obtained by using the more efficient calibration and detection method, and the obtained degree of deviation is compared to a preset degree of deviation and a prewarning message is sent out when the preset degree of deviation is not met, so as to timely inform related workers to carry out inspection and maintenance of the apparatus, improving a stability of a manufacture procedure.

In other embodiments, the to-be-detected wafer at least includes one of a product wafer and a monitor wafer.

In other embodiments, the to-be-detected wafer includes a product wafer and a monitor wafer; the acquiring a degree of deviation between the first detection apparatus and the second detection apparatus and issuing a prewarning information if the degree of deviation is less than a degree of deviation threshold includes: performing a degree of deviation detection on the first detection apparatus and the second detection apparatus based on the monitor wafer, so as to acquire a first degree of deviation between the first detection apparatus and the second detection apparatus; if the first degree of deviation is less than a first degree of deviation threshold, performing a degree of deviation detection on the first detection apparatus and the second detection apparatus based the product wafer, so as to acquire a second degree of deviation between the first detection apparatus and the second detection apparatus; if the second degree of deviation is less than a second degree of deviation threshold, issuing a prewarning information. A degree of deviation detection is performed by first using the monitor wafer, and if the degree of deviation is less than the first degree of deviation threshold, the apparatus may have a large match error at this point; then, a degree of deviation detection is performed by using the product wafer, and when the degree of deviation is less than the second degree of deviation threshold, the prewarning information is issued now. With dual detection, the stability of the manufacture procedure is further guaranteed, and the workloads of the related workers are reduced in the meantime.

In other embodiments, the performing a degree of deviation detection on the first detection apparatus and the second detection apparatus includes: performing the degree of deviation detection at a preset time interval or in real time. A time of detecting the degree of deviation of the apparatus may be set as needed. In the case of a low precision requirement, a timing detection may save energy and improve manufacturing procedure efficiency. In the case of a high precision requirement, a real-time detection may improve the precision of the detection.

In other embodiments, the prewarning method of the apparatus is written in a test program, and the degree of deviation detection is performed when the first detection apparatus and the second detection apparatus are running; after the prewarning module issues the prewarning information, the method further includes: stopping the measurements by the first detection apparatus and the second detection apparatus. When the degree of deviation between various line width scanning electron microscope apparatuses does not meet the preset degree of deviation, the first detection apparatus and the second detection apparatus stop the measurements, so as to avoid manufacturing a wafer of a poor quality, saving a manufacture cost.

According to an embodiment of the present disclosure, a prewarning system of an apparatus for detecting a degree of deviation between apparatuses is further provided, including: a first acquisition module for acquiring a first detection result, the first detection result being a measurement result of a critical dimension of a first target detection area of a to-be-detected wafer measured by a first detection apparatus; a second acquisition module for acquiring a second detection result, the second detection result being a measurement result of a critical dimension of a second target detection area of the to-be-detected wafer measured by the first detection apparatus; a third acquisition module for acquiring a third detection result, the third detection result being a measurement result of a critical dimension of a third target detection area of the to-be-detected wafer measured by a second detection apparatus; a first processing module connected to a first detection module, a second detection module, and a third detection module, the first processing module acquiring a measurement difference between the first detection apparatus and the second detection apparatus based on the first detection result, the second detection result, and the third detection result; a second processing module connected to the first processing module, the second processing module acquiring a degree of deviation between the second detection apparatus and the first detection apparatus based on the measurement difference; and a third processing module connected to the second processing module, the third processing module being configured to judge whether the degree of deviation meets a degree of deviation threshold, and issue a control signal if the degree of deviation is less than a degree of deviation threshold; a prewarning module connected to the third processing module, the prewarning module issuing a prewarning information based on the control signal.

As compared to a related art, the degree of deviation between the first detection apparatus and the second detection apparatus is obtained by using the more efficient calibration and detection method, and the obtained degree of deviation is compared to a preset degree of deviation and a prewarning message is sent out when the preset degree of deviation is not met, so as to timely inform related workers to carry out inspection and maintenance of the apparatus, improving a stability of a manufacture procedure.

DESCRIPTION OF EMBODIMENTS

At present, a calibration method of ABBA (where the first A denotes that a first detection apparatus detects a critical dimension of a first target detection area, the first B denotes that a second detection apparatus detects the critical dimension of the first target detection area, the second B denotes the second target detection apparatus detects a critical dimension of a second target detection area, and the second A denotes the first target detection apparatus detects the critical dimension of the second target detection area) has a complicated flow, a hysteresis, and a low efficiency, and cannot timely avoid a measurement difference of a line width scanning electron microscope apparatus, thereby exerting an influence on a manufacturing procedure.

In order to solve the problem described above, an apparatus match detection method according to an embodiment of the present disclosure is provided, including: providing a to-be-detected wafer, a first detection apparatus, and a second detection apparatus, the to-be-detected wafer including a first target detection area, a second target detection area, and a third target detection area, wherein the first target detection area and the second target detection area are independent of each other, and the third target detection area at least includes the first target detection area and the second target detection area; measuring by the first detection apparatus a critical dimension of the first target detection area to obtain a first detection result; measuring by the second detection apparatus a critical dimension of the third target detection area to obtain a third detection result; measuring by the first detection apparatus a critical dimension of the second target detection area to obtain a second detection result; acquiring a measurement difference between the first detection apparatus and the second detection apparatus based on the first detection result, the second detection result, and the third detection result; and acquiring a degree of deviation between the second detection apparatus and the first detection apparatus based on the measurement difference.

In order to make the objectives, the technical solutions, and the advantages of the embodiments of the present disclosure more clear, the detailed description of the embodiments of the present disclosure is given below in combination with the accompanying drawings. Those skilled in the art can understand that many technical details are provided in the embodiments of the present disclosure so as to make the readers better understand the present disclosure. However, even if these technical details are not provided and based on a variety of variations and modifications of the following embodiments, the technical solutions sought for protection in the present disclosure can also be realized. The division of embodiments below is for convenience of description, and is not intended to limit particular implementations of the present disclosure in any way. Individual embodiments may be combined with and referred to each other based on the premise of no contradictions.

Figure 1:
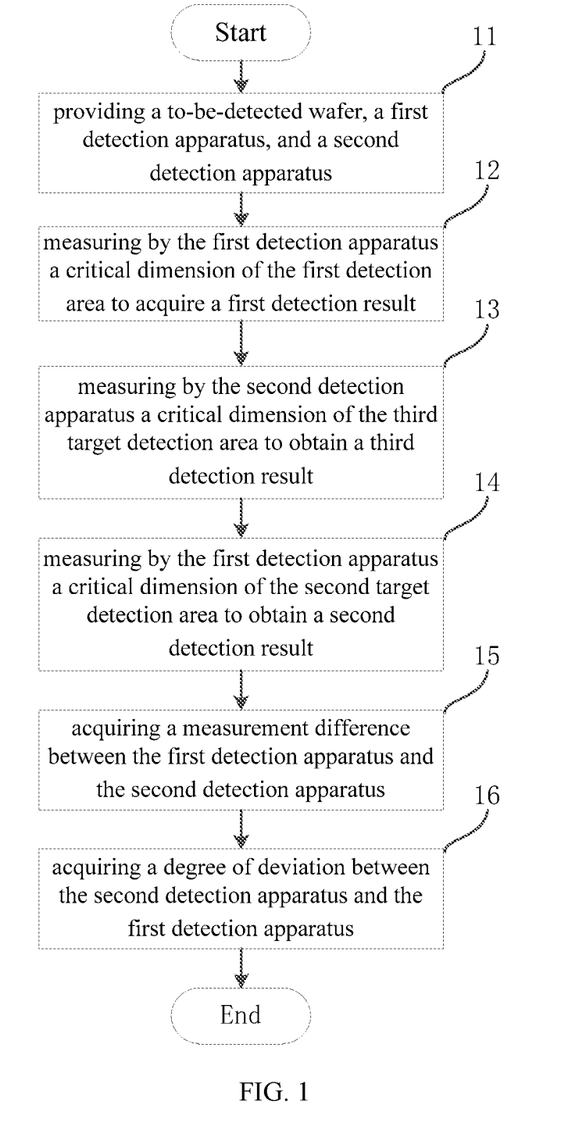
FIG. 1 is a flowchart of an apparatus match detection method according to an embodiment of the present disclosure.
Figure 2:
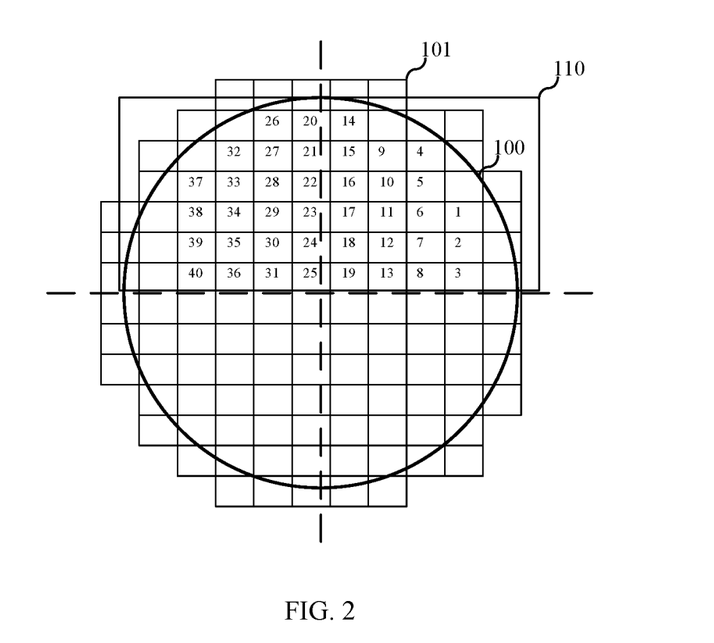
FIG. 2 is a schematic principle diagram of acquiring a first detection result in an embodiment of the present disclosure.
Figure 3:
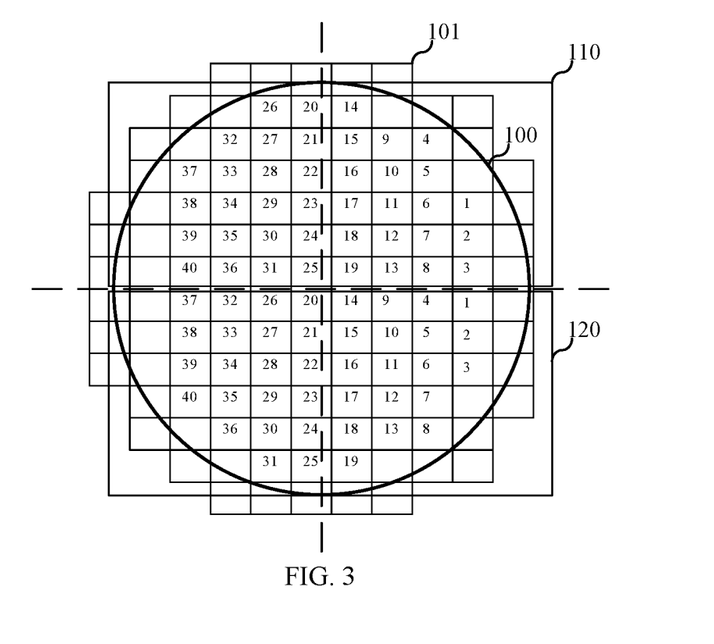
FIG. 3 is a schematic principle diagram of acquiring a second detection result in an embodiment of the present disclosure.
Figure 4:
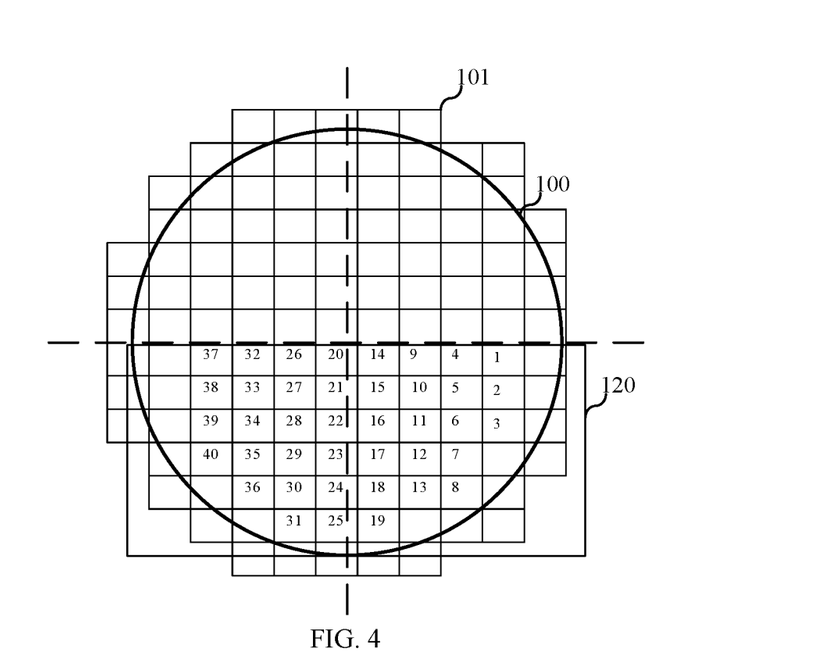
FIG. 4 is a schematic principle diagram of acquiring a third detection result in an embodiment of the present disclosure.

FIG. 1 is a flowchart of an apparatus match detection method according to the embodiment; FIG. 2 is a schematic principle diagram of acquiring a first detection result in the embodiment; FIG. 3 is a schematic principle diagram of acquiring a second detection result in the embodiment; FIG. 4 is a schematic principle diagram of acquiring a third detection result in the embodiment. Implementation details of the apparatus match detection method according to the embodiment are specifically described below in combination with the accompanying drawings.

Referring to FIG. 1, an apparatus match detection method includes the following steps.

Step 11, providing a to-be-detected wafer, a first detection apparatus, and a second detection apparatus.

Specifically, in the embodiment, both of the first detection apparatus and the second detection apparatus are line width scanning electron microscope apparatus, i.e., CDSEM apparatus. The apparatus match detection method according to the embodiment may be applied to detect a degree of deviation between two apparatuses different from each other, and may also be applied to a degree of deviation detection between any two of more than two apparatuses that are different from each other.

The to-be-detected wafer includes a first target detection area, a second target detection area, and a third target detection area, wherein the first target detection area and the second target detection area are independent of each other, and the third target detection area at least includes the first target detection area and the second target detection area; the to-be-detected wafer is configured to perform a degree of deviation detection on a first detection apparatus and a second detection apparatus.

Specifically, the to-be-detected wafer is divided into a plurality of detection units. As shown in FIGS. 2 to 4, each of small squares represents a detection unit 101.

The first target detection area 110 at least includes M first detection units, and M is a natural number greater than 1. In the embodiment, the first target detection area 110 includes 40 first detection units (i.e., M=40), namely the first detection units labeled with 1 to 40 included in the first target detection area 110 of FIG. 2. It should be noted that, in the embodiment, the description is provided by taking 40 first detection units as an example, so as to enable those skilled in the art to understand a detection flow according to the solution, rather than intending to limit the solution. In a particular disclosure, the number of the first detection units required is determined from the size of the divided detection units.

The second target detection area 120 at least includes H second detection units, and H is a natural number greater than 1. In the embodiment, the second target detection area 120 includes 40 second detection units (i.e., H=40), namely the second detection units labeled with 1 to 40 included in the second target detection area 120 of FIG. 4. It should be noted that, in the embodiment, the description is provided by taking 40 second detection units as an example, so as to enable those skilled in the art to understand a detection flow according to the solution, rather than intending to limit the solution. In a particular disclosure, the number of the second detection units required is determined from the size of the divided detection units.

The third target detection area at least contains the first target detection area 110 and the second target detection area 120. In the embodiment, the third target detection area includes the first target detection area 110 and the second target detection area 120.

Specifically, the third target detection area at least includes L third detection units, and L is a natural number greater than a sum of H and M. In the embodiment, the third target detection area includes 80 third detection units (i.e., L=H+M=80), i.e., 80 third detection units are the detection units labeled with 1 to 40 included in the first detection area 110 and the detection units labeled with 1 to 40 included in the second detection area 120 of FIG. 4.

Step 12, as shown in FIG. 2, the first detection apparatus measures a critical dimension of the first detection area 110 of the to-be-detected wafer 100 to obtain a first detection result.

The first detection apparatus is configured to measure the critical dimension of each of 40 (M=40) first detection units, so as to obtain a first unit detection result of each of the first detection units; wherein the critical dimension refers to a minimum dimension of a graphic on a wafer, for example, a minimum line width of a line, or a minimum size of a contact hole.

A first detection result is obtained based on 40 first unit detection results. Specifically, the first detection result is a mean value of 40 first unit detection results.

Step 13, as shown in FIG. 3, the second detection apparatus measures a critical dimension of a third detection area; in the embodiment, the third detection area is the first detection area 110 plus the second detection area 120 of the to-be-detected wafer 100 to obtain a third detection result.

The second detection apparatus is configured to measure a critical dimension of each detection unit 101 of 80 third detection units, so as to obtain a third unit detection result of each detection unit 101.

A third detection result is obtained based on 80 third unit detection results. Specifically, the third detection result is a mean value of 80 third unit detection results.

Step 14, as shown in FIG. 4, the first detection apparatus measures a critical dimension of the second detection area 120 of the to-be-detected wafer 100 to obtain a second detection result.

The first detection apparatus is configured to measure a critical dimension of each of 40 second detection units, so as to obtain a second unit detection result of each of the second detection units.

A second detection result is obtained based on 40 second unit detection results. Specifically, the second detection result is a mean value of 40 second unit detection results.

Step 15, a measurement difference between the first detection apparatus and the second detection apparatus is obtained. Specifically, the measurement difference between the first detection apparatus and the second detection apparatus is obtained based on the first detection result, the second detection result, and the third detection result.

Specifically, the measurement difference is obtained by using a preset equation of difference calculation:

the preset equation of difference calculation: $\Delta=(A1-2B+A2)/2$, wherein $\Delta$ denotes the measurement difference, A1 denotes the first detection result, B denotes the third detection result, and A2 denotes the second detection result.

Step 16, a degree of deviation between the second detection apparatus and the first detection apparatus is obtained. Specifically, the degree of deviation between the second detection apparatus and the first detection apparatus is obtained based on the measurement difference.

Specifically, the degree of deviation is obtained by using a preset equation of match calculation:

the preset equation of match calculation: $a=(A1-2B+A2)/2A1=\Delta/A1$, wherein a denotes a degree of deviation between the second detection apparatus and the first detection apparatus, A1 denotes the first detection result, B denotes the third detection result, and A2 denotes the second detection result.

Such a test method of ABA, as compared with an existing method, keeps accuracy and simplifies a test flow of a degree of deviation of an apparatus, improving an efficiency of an apparatus match test. Effects of the solution according to the embodiment are demonstrated below in combination with particular principles.

Regarding a precision thereof, errors of the to-be-detected wafer which are caused by different CDSEM apparatuses include $\Delta T$ and $\Delta C$; wherein $\Delta T$ denotes a measurement error, i.e., an error occurs in the case of measuring a same to-be-detected wafer by different CDSEM apparatuses, and the measurement error is a vector; $\Delta C$ denotes a graphic variation error and an electrification error, and the $\Delta C$ is a vector. The graphic variation error is an error of measuring different detection areas of the same to-be-detected wafer; the electrification error is an error caused by continuous detection of the same to-be-detected wafer.

In the case where the measurement difference $\Delta$ between the first detection apparatus and the second detection apparatus is obtained by using the third detection result B and the first detection result A1, $\Delta=(A1-B)=\Delta T+\Delta C1$. $\Delta C1$ denotes the graphic variation error and the electrification error which are calculated by using this manner.

In the case where the measurement difference $\Delta$ between the first detection apparatus and the second detection apparatus is obtained by using the third detection result B and the second detection result A2, $\Delta=(A2-B)=\Delta T+\Delta C2$. $\Delta C2$ denotes the graphic variation error and the electrification error which are calculated in this manner.

As can be know from aforementioned description, the first detection result A1 is obtained through detection of the first detection area by the first detection apparatus, the second detection result A2 is obtained through detection of the second detection area by the first detection apparatus. Since the detections are performed by the same apparatus, the measurement differences thereof have a same magnitude. The third detection result is obtained through detection of the third detection area by the second detection apparatus, and the third detection area includes the first detection area and the second detection area which are independent of each other. By subtracting the third detection result from the result of detecting the first detection area or the second detection area by the first detection apparatus, the measurement differences have opposite directions, i.e., the vector $\Delta C1$ and the vector $\Delta C2$ have the same magnitude and opposite directions ($\Delta C1+\Delta C2=0$).

If the test method of ABA according to the present disclosure, namely $\Delta=(A1-2B+A2)/2=((A1-B)+(A2-B)]/2=(2\Delta T+\Delta C1+\Delta C2)/2=\Delta T$, the obtained measurement differenceL between the first detection apparatus and the second detection apparatus exactly eliminates the effect of the graphic variation error and the electrification error.

It should be noted that, in the embodiment, the description is provided by taking the third detection area equal to the sum of the first detection area and the second detection area as an example, so as to clearly describe the detection method according to the disclosure, rather than intending to limit the solution. In other embodiments, the third detection area may also contain other detection areas other than the first detection area and the second detection area, and the particular range of the third detection area is set based on a practical manufacture process.

Therefore, as compared to a related art, the degree of deviation between the first detection apparatus and the second detection apparatus is obtained by using the calibration and detection method of ABA, the detection is more efficient, and a measurement difference between various line width scanning electron microscope apparatuses may be found out timely, avoiding the instability of a manufacture procedure caused by the measurement differences of the apparatuses.

The division of the steps above is merely for clarity of description. The steps may be combined to one step or some of the steps may be split to a plurality of steps when being implemented, and all of these fall within the protection scope of the present patent as long as they have a same logic relationship. Adding insignificant modifications to the flow or introducing inessential designs without changing key designs of the flow fall within the protection scope of the patent.

Figure 5:
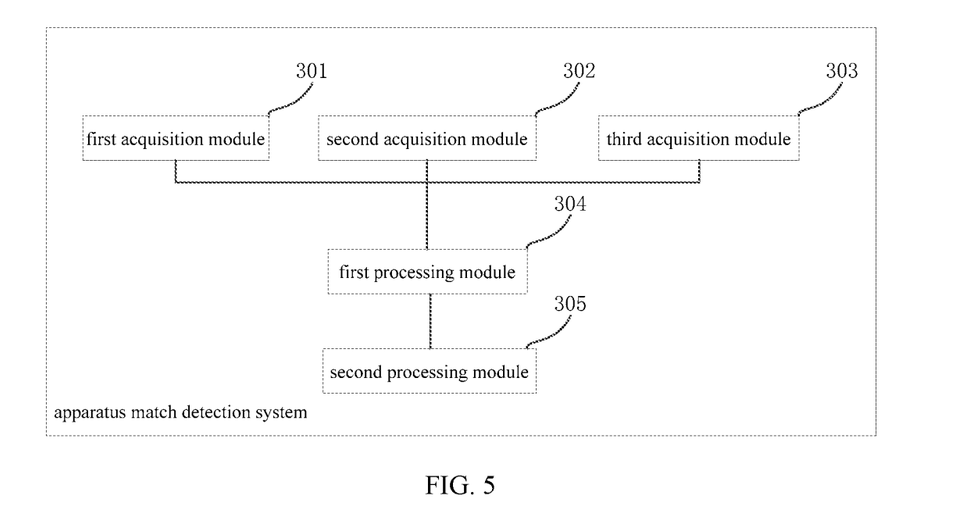
FIG. 5 is a schematic structural diagram of an apparatus match detection system according to another embodiment of the present disclosure.
Figure 6:
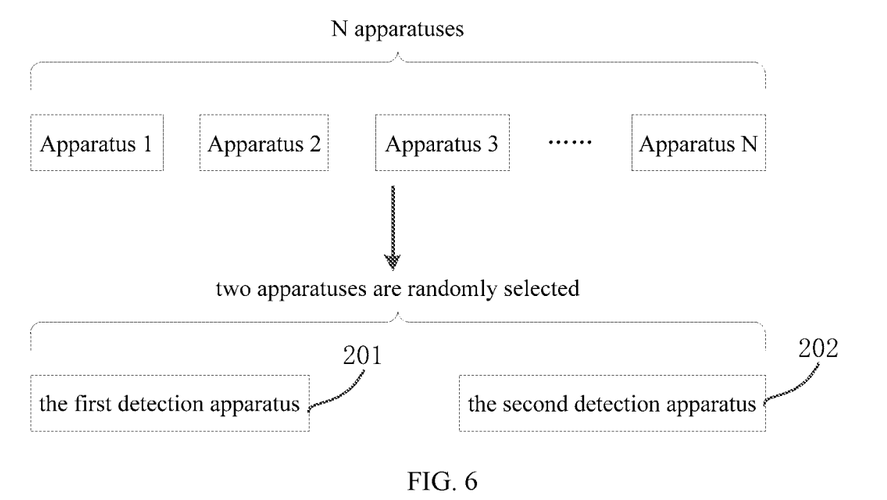
FIGS. 6 and 7 are schematic principle diagrams of determining a first detection apparatus and a second detection apparatus from N detection apparatuses according to another embodiment of the present disclosure.
Figure 7:
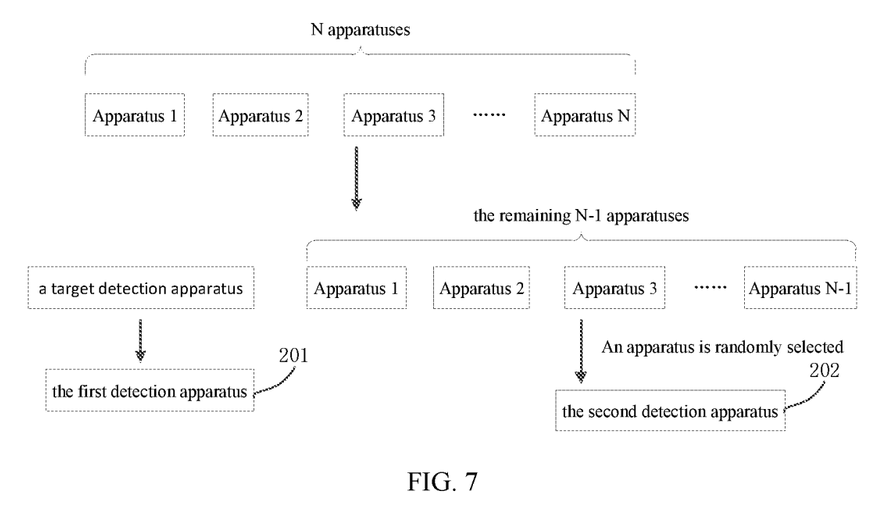

Another embodiment of the present disclosure involves an apparatus match detection system. FIG. 5 is a schematic structural diagram of an apparatus match detection system according to the embodiment; FIGS. 6 and 7 are schematic principle diagrams of determining a first detection apparatus and a second detection apparatus from N detection apparatuses according to the embodiment. The apparatus match detection system according to the embodiment is described in detail below in combination with the accompanying drawings. Portions that are identical or similar to the embodiments described above may not be repeated below.

Referring to FIG. 5, an apparatus match detection system 300 configured to detect a degree of deviation between detection apparatuses includes the following modules:

a first acquisition module 301 for acquiring a first detection result, the first detection result being a result of measuring a critical dimension of a first target detection area of a to-be-detected wafer by a first detection apparatus.

a second acquisition module 302 for acquiring a second detection result, the second detection result being a result of measuring a critical dimension of a second target detection area of the to-be-detected wafer by the first detection apparatus.

a third acquisition module 303 for acquiring a third detection result, the third detection result being a result of measuring a critical dimension of a third target detection area of the to-be-detected wafer by a second detection apparatus.

a first processing module 304 connected to the first detection module 301, the second detection module 302, and the third detection module 303 acquiring a measurement difference between the first detection apparatus and the second detection apparatus based on the first detection result, the second detection result, and the third detection result.

a second processing module 305 connected to the first processing module 304 acquires the degree of deviation between the second detection apparatus and the first detection apparatus being obtained based on the measurement difference.

Specifically, the first detection apparatus measures a critical dimension of the first target detection area to obtain the first detection result; the second detection apparatus measures a critical dimension of the third target detection area to obtain the third detection result; the first detection apparatus measures a critical dimension of the second target detection area to obtain the second detection result; the measurement difference between the first detection apparatus and the second detection apparatus is obtained based on the first detection result, the second detection result, and the third detection result; and the degree of deviation between the second detection apparatus and the first detection apparatus is obtained based on the measurement difference.

In a specific disclosure, selecting the first detection apparatus and the second detection apparatus from N apparatuses includes two modes below:

Mode 1: referring to FIG. 6, two apparatuses are randomly selected from N apparatuses as the first detection apparatus and the second detection apparatus; the apparatus match detection method according to an embodiment of the present disclosure is used to detect the first detection apparatus and the second detection apparatus; the above steps are performed repeatedly, until the degree of deviation detection of any two of N apparatuses are done.

Mode 2: referring to FIG. 7, a target detection apparatus is selected from N apparatuses as the first detection apparatus, and an apparatus is selected form the remaining N−1 apparatuses as the second detection apparatus; the apparatus match detection method according to an embodiment of the present disclosure is used to detect the first detection apparatus and the second detection apparatus; the above steps are performed repeatedly, until the degree of deviation are detected between the target detection apparatus and each of the remaining N−1 apparatuses.

As compared to a related art, the embodiment acquires the degree of deviation between the first detection apparatus and the second detection apparatus by using the more efficient calibration and detection method, and a measurement difference between various line width scanning electron microscope apparatuses are found out timely, avoiding instability of a manufacture procedure caused by the measurement differences of the apparatuses.

Since the embodiments described above and this embodiment correspond to each other, this embodiment may be implemented cooperatively with the embodiments described above. The related technical details mentioned in the embodiments described above remains valid in this embodiment. The technical effects achieved in the embodiments described above may also be realized in this embodiment. In order to reduce repetitions, here is not described again. Correspondingly, the related technical details mentioned in this embodiment may also be applied in the embodiments described above.

It is worth mentioning that all of the units which are involved in this embodiment are logical units. In a practical disclosure, a logical unit may be a physical unit, and may also be a part of a physical unit, and may further be implemented in a combination of several physical units. In addition, in order to highlight the novel parts of the present disclosure, the embodiment does not introduce units which are not closely tied to the solutions to the technical problems proposed in the present disclosure, but it does not mean no other units exist in the embodiment.

Figure 8:
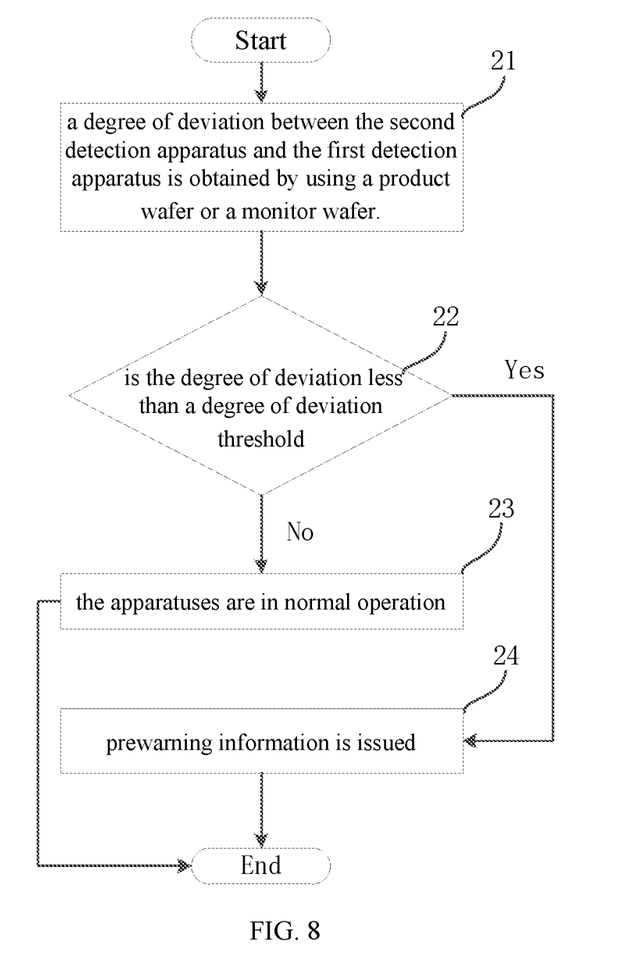
FIG. 8 is a flowchart of a prewarning method of an apparatus according to yet another embodiment of the present disclosure.

Yet another embodiment of the present disclosure involves a prewarning method of an apparatus. FIG. 8 is a flowchart of a prewarning method of an apparatus according to the embodiment. Implementation details of the prewarning method of the apparatus according to the embodiment are specifically described below in combination with the accompanying drawings. Portions that are identical or similar to the embodiments described above may not be repeated below in detail.

Referring to FIG. 8, the prewarning method of the apparatus includes the following steps:

Step 21, a degree of deviation between the second detection apparatus and the first detection apparatus is obtained by using a product wafer or a monitor wafer. In the embodiment, the monitor wafer is a Non-Product Wafer (NPW).

Specifically, a to-be-detected wafer, a first detection apparatus and a second detection apparatus are provided, and the to-be-detected wafer at least includes any one of a product wafer and a monitor wafer; a degree of deviation detection is performed on a first detection apparatus and a second detection apparatus. The flow of the degree of deviation detection is the same as a particular embodiment, and not repeated here.

The performing a degree of deviation detection on a first detection apparatus and a second detection apparatus includes two modes below:

Mode 1: the degree of deviation detection is performed on the first detection apparatus and the second detection apparatus based on a preset time interval. For example, the degree of deviation detection is performed on the first detection apparatus and the second detection apparatus every 1, 3, 5, 6, and 8 hours.

Mode 2: the degree of deviation detection is performed on the first detection apparatus and the second detection apparatus in real time.

A time of detecting the degree of deviation of the apparatus may be set as needed. In the case of a low precision requirement, a timing detection may save energy and improve manufacturing procedure efficiency. In the case of a high precision requirement, a real-time detection may improve the precision of the detection.

In the case of a real-time mode, a result of the degree of deviation detection is statistically processed and monitored, and converts to a form of a table or a graph. Specifically, the result of the degree of deviation detection of the first detection apparatus and the second detection apparatus is obtained in real time, and statistically processed and monitored, and uploaded to a manufacture automation control system (an MM system), and a match detection result is converted to a form of table or a graph, i.e., an SPC table is output by the MM system. With an SPC table, it can be seen intuitively a changing process of the degree of deviation of the first detection apparatus and the second detection apparatus, and whether the degree of deviation falls within a preset dimension range.

Step 22, is the degree of deviation less than a degree of deviation threshold? Specifically, if the degree of deviation between the first detection apparatus and the second detection apparatus is greater than and equal to the degree of deviation threshold, step 23 is performed, in which the first detection apparatus and the second detection apparatus are in normal operation; if the degree of deviation between the first detection apparatus and the second detection apparatus is less than the degree of deviation threshold, step 24 is performed to issue prewarning information.

Step 23, the apparatuses are in normal operation.

Step 24, prewarning information is issued. Specifically, issuing prewarning information may inform, by way of PAN, a related worker apparatus to perform inspection and maintenance of the apparatus.

It should be noted that, in the embodiment, the prewarning method of the apparatus is written in a test program, and the degree of deviation detection is performed when the first detection apparatus and the second detection apparatus are running. That is, a degree of deviation between different CDSEM apparatuses is automatically detected. In the embodiment, after issuing the prewarning information, the first detection apparatus and the second detection apparatus are further controlled to stop the measurement process, so as to avoid manufacturing a wafer of a poor quality, saving manufacture cost.

As compared to a related art, the degree of deviation between the first detection apparatus and the second detection apparatus is obtained by using the more efficient calibration and detection method, and the obtained degree of deviation is compared to a preset degree of deviation and a prewarning message is sent out when the preset degree of deviation is not met, so as to timely inform related workers to carry out inspection and maintenance of the apparatus, improving a stability of a manufacture procedure.

The division of the steps above is merely for clarity of description. The steps may be combined to one step or some of the steps may be split to a plurality of steps when being implemented, and all of these fall within the protection scope of the present patent as long as they have a same logic relationship. Adding insignificant modifications to the flow or introducing inessential designs without changing key designs of the flow fall within the protection scope of the patent.

Still another embodiment of the present disclosure involves a prewarning method of an apparatus, this embodiment and the previous embodiment are substantially the same, except that: this embodiment employs a combination of the monitor wafer and the product wafer to implement the prewarning method of the apparatus.

Figure 9:
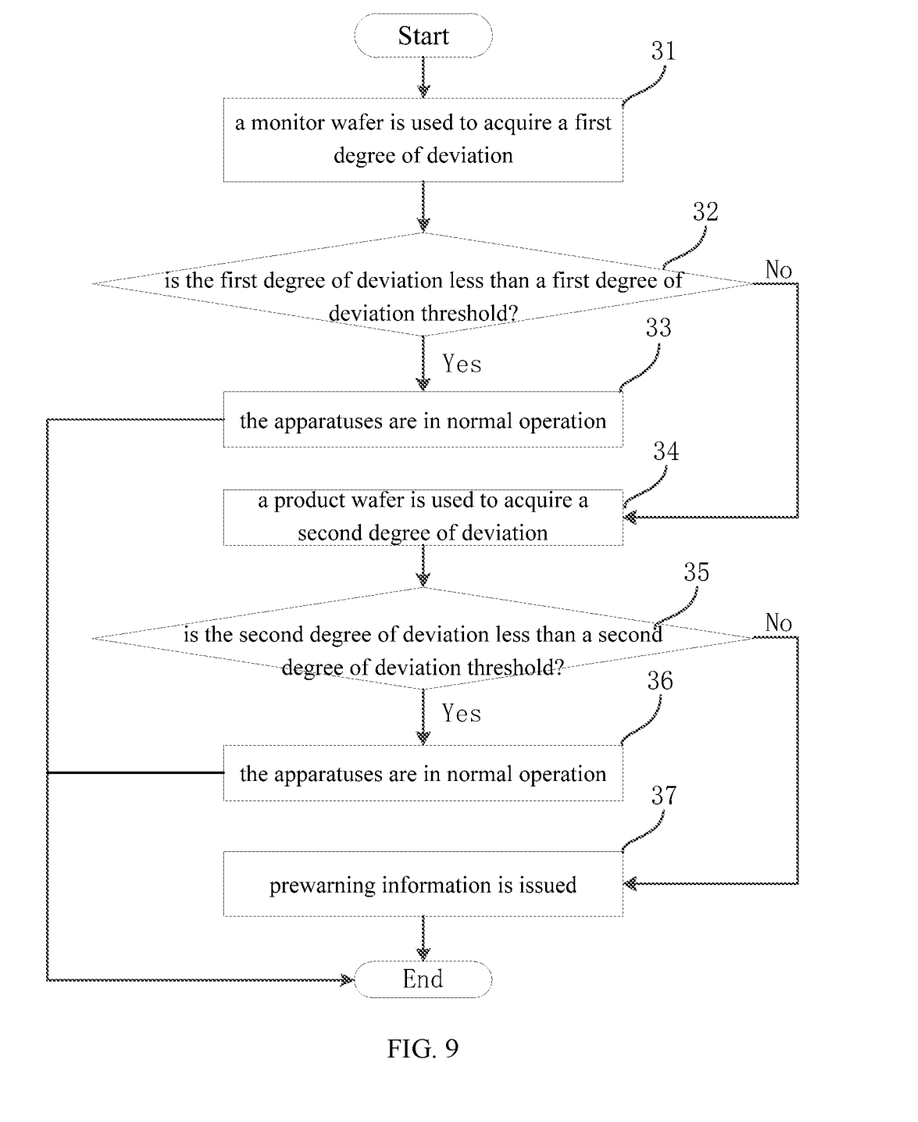
FIG. 9 is a flowchart of a prewarning method of an apparatus according to still another embodiment of the present disclosure.

FIG. 9 is a flowchart of a prewarning method of an apparatus according to the embodiment. Implementation details of the prewarning method of the apparatus according to the embodiment are specifically described below. Portions that are identical or similar to the embodiments described above may not be repeated below in detail.

Referring to FIG. 9, the prewarning method of the apparatus includes the following steps.

Step 31, a monitor wafer is used to acquire a first degree of deviation.

Specifically, based on the monitor wafer, a degree of deviation detection is performed on the first detection apparatus and the second detection apparatus, so as to acquire the first degree of deviation between the first detection apparatus and the second detection apparatus. The flow of the degree of deviation detection is the same as a particular embodiment, and not repeated here.

Step 32, is the first degree of deviation less than a first degree of deviation threshold?

Specifically, if the first degree of deviation is greater than and equal to the first degree of deviation threshold, step 33 is performed, in which the first detection apparatus and the second detection apparatus are in normal operation; if the first degree of deviation is less than the first degree of deviation threshold, step 34 is performed to acquire a second degree of deviation by using a product wafer.

Step 33, the apparatuses are in normal operation.

Step 34, a product wafer is used to acquire a second degree of deviation.

Specifically, based on the product wafer, the degree of deviation detection is performed on the first detection apparatus and the second detection apparatus, so as to acquire the second degree of deviation between the first detection apparatus and the second detection apparatus. The flow of the degree of deviation detection is the same as a particular embodiment, and not repeated here.

Step 35, is the second degree of deviation less than a second degree of deviation threshold?

Specifically, if the second degree of deviation is greater than and equal to the second degree of deviation threshold, step 36 is performed, in which the first detection apparatus and the second detection apparatus are in normal operation; if the second degree of deviation is less than the second degree of deviation threshold, step 37 is performed to issue a prewarning information.

It should be noted that, the first degree of deviation threshold is a degree of deviation which is required to be reached in a case of a detection is performed by using a monitor wafer, and the second degree of deviation threshold is a degree of deviation which is required to be reached in a case of a detection is performed by using a product wafer. A relationship between the first degree of deviation threshold and the second degree of deviation threshold is not limited in the embodiment. That is, in a specific implementation process, the second degree of deviation threshold may be less than the first degree of deviation threshold, and may be greater than the first degree of deviation threshold, or they are set to be equal to each other.

Step 36, the apparatuses are in normal operation.

Step 37, prewarning information is issued. Specifically, issuing prewarning information may inform, by way of PAN, a related worker apparatus to perform inspection and maintenance of the apparatus.

In the embodiment, a degree of deviation detection is performed on the apparatus by using the monitor wafer, and if the first degree of deviation does not meet the first degree of deviation threshold, the apparatus may have a large match error at this point; then, a degree of deviation detection is performed on the apparatus by using the product wafer, and when the second degree of deviation does not meet the second degree of deviation threshold, the prewarning information is issued now. With a dual detection manner, the stability of the manufacture procedure is further guaranteed, and the workloads of the related workers are reduced in the meantime.

The division of the steps above is merely for clarity of description. The steps may be combined to one step or some of the steps may be split to a plurality of steps when being implemented, and all of these fall within the protection scope of the present patent as long as they have a same logic relationship. Adding insignificant modifications to the flow or introducing inessential designs without changing key designs of the flow fall within the protection scope of the patent.

Figure 10:
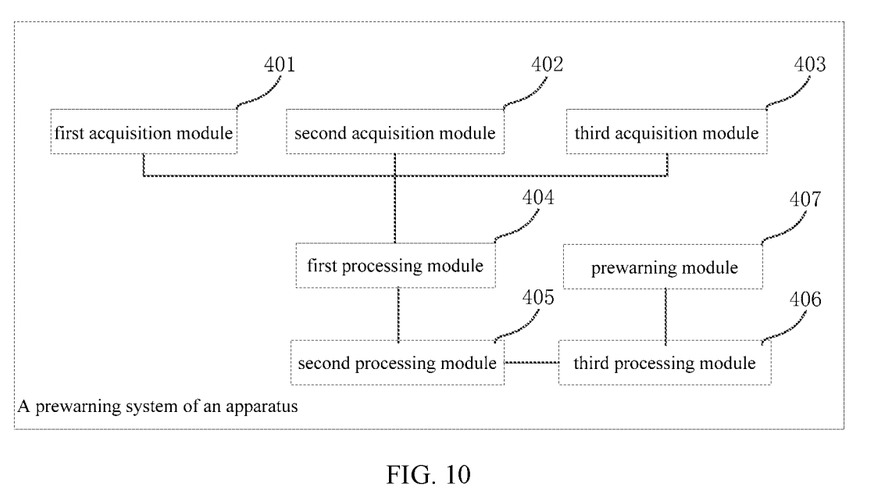
FIG. 10 is a schematic structural diagram of a prewarning system of an apparatus according to yet still another embodiment of the present disclosure.

Yet still another embodiment of the present disclosure involves a prewarning system of an apparatus. FIG. 10 is a schematic structural diagram of a prewarning system of an apparatus according to the embodiment. Implementation details of the prewarning system of the apparatus according to the embodiment are specifically described below. Portions that are identical or similar to the embodiments described above may not be repeated below in detail.

Referring to FIG. 10, the prewarning system 400 of the apparatus configured to detect a degree of deviation between detection apparatuses includes the following modules:

a first acquisition module 401 for acquiring a first detection result, the first detection result being a result of measuring a critical dimension of a first target detection area of a to-be-detected wafer by a first detection apparatus.

a second acquisition module 402 for acquiring a second detection result, the second detection result being a result of measuring a critical dimension of a second target detection area of the to-be-detected wafer by the first detection apparatus.

a third acquisition module 403 for acquiring a third detection result, the third detection result being a result of measuring a critical dimension of a third target detection area of the to-be-detected wafer by a second detection apparatus.

a first processing module 404 connected to the first detection module 401, the second detection module 402, and the third detection module 403, acquiring a measurement difference between the first detection apparatus and the second detection apparatus based on the first detection result, the second detection result, and the third detection result.

a second processing module 405 connected to the first processing module 404, acquiring the degree of deviation between the second detection apparatus and the first detection apparatus based on the measurement difference.

a third processing module 406 connected to the second processing module 405, being configured to judge whether the degree of deviation meets a degree of deviation threshold, and issue a control signal if the degree of deviation is less than the degree of deviation threshold.

A prewarning module 407 connected to the third processing module 406, issuing prewarning information based on the control signal.

It should be noted that, in the embodiment, the prewarning module is a virtual module which is independent of the first detection apparatus and the second detection apparatus; in other embodiments, the prewarning module may be integrated to at least one of the first detection apparatus or the second detection apparatus.

Specifically, the first detection apparatus measures a critical dimension of the first target detection area to obtain the first detection result; the second detection apparatus measures a critical dimension of the third target detection area to obtain the third detection result; the first detection apparatus measures a critical dimension of the second target detection area to obtain the second detection result; the measurement difference between the first detection apparatus and the second detection apparatus is obtained based on the first detection result, the second detection result, and the third detection result; and the degree of deviation between the second detection apparatus and the first detection apparatus is obtained based on the measurement difference.

If the degree of deviation between the first detection apparatus and the second detection apparatus is greater than or equal to the degree of deviation threshold, the first detection apparatus and the second detection apparatus are in normal operation; if the degree of deviation between the first detection apparatus and the second detection apparatus is less than the degree of deviation threshold, the prewarning module 407 issues the prewarning information.

As compared to a related art, the degree of deviation between the first detection apparatus and the second detection apparatus is obtained by using the more efficient calibration and detection method, and the obtained degree of deviation is compared to a preset degree of deviation and a prewarning message is sent out when the preset degree of deviation is not met, so as to timely inform related workers to carry out inspection and maintenance of the apparatus, improving the stability of the manufacture procedure.

Since the embodiments described above and this embodiment correspond to each other, this embodiment may be implemented cooperatively with the embodiments described above. The related technical details mentioned in the embodiments described above remains valid in this embodiment. The technical effects achieved in the embodiments described above may also be realized in this embodiment. In order to reduce repetitions, here is not described again. Correspondingly, the related technical details mentioned in this embodiment may also be applied in the embodiments described above.

It is worth mentioning that all of the units which are involved in this embodiment are logical units. In a practical disclosure, a logical unit may be a physical unit, and may also be a part of a physical unit, and may further be implemented in a combination of several physical units. In addition, in order to highlight the novel parts of the present disclosure, the embodiment does not introduce units which are not closely tied to the solutions to the technical problems proposed in the present disclosure, but it does not mean no other units exist in the embodiment.

Those skilled in the art can understand that the embodiments described above are particular embodiments for implementing the present disclosure. In practical uses, various changes in forms and details may be made to the implementations without departing from the spirit and scope of the present disclosure.

What is claimed is:

1. An apparatus match detection method, comprising:
   providing a to-be-detected wafer, a first detection apparatus, and a second detection apparatus, the to-be-detected wafer comprising a first target detection area, a second target detection area, and a third target detection area, wherein the first target detection area and the second target detection area are independent of each other, and the third target detection area at least includes the first target detection area and the second target detection area;
   measuring by the first detection apparatus a critical dimension of the first detection area to acquire a first detection result;
   measuring by the second detection apparatus a critical dimension of the third detection area to acquire a third detection result;
   measuring by the first detection apparatus a critical dimension of the second detection area to acquire a second detection result;
   acquiring a measurement difference between the first detection apparatus and the second detection apparatus based on the first detection result, the second detection result, and the third detection result; and
   acquiring a degree of deviation between the second detection apparatus and the first detection apparatus based on the measurement difference.

2. The apparatus match detection method according to claim 1, wherein the acquiring the measurement difference between the first detection apparatus and the second detection apparatus based on the first detection result, the second detection result, and the third detection result comprises:
   acquiring the measurement difference by using a preset equation of difference calculation:

$$\Delta = (A1 - 2B + A2)/2,$$

wherein $\Delta$ denotes the measurement difference, A1 denotes the first detection result, B denotes the third detection result, and A2 denotes the second detection result.

3. The apparatus match detection method according to claim 1, comprising:
   the first target detection area comprises M first detection units, the second target detection area comprises H second detection units, and the third target detection area comprises L third detection units; each of M and H is a natural number greater than 1, and L is a natural number greater than a sum of M and H;
   the first detection result is a mean value obtained by measuring and averaging the critical dimensions of the M first detection units;
   the second detection result is a mean value obtained by measuring and averaging the critical dimensions of the H second detection units; and
   the third detection result is a mean value obtained by measuring and averaging the critical dimensions of the L third detection units.

4. A prewarning method of an apparatus, comprising:
   providing a to-be-detected wafer, a first detection apparatus, and a second detection apparatus, the to-be-detected wafer comprising a first target detection area, a second target detection area, and a third target detection area, wherein the first target detection area and the second target detection area are independent of each other, and the third target detection area at least includes the first target detection area and the second target detection area;
   based on the to-be-detected wafer, performing a degree of deviation detection on the first detection apparatus and the second detection apparatus by using the apparatus match detection method according to claim 1, so as to acquire a degree of deviation between the first detection apparatus and the second detection apparatus; and
   issuing a prewarning information if the degree of deviation is less than a degree of deviation threshold.

5. The prewarning method of the apparatus according to claim 4, wherein the to-be-detected wafer comprises one of a product wafer and a monitor wafer.

6. The prewarning method of the apparatus according to claim 4, comprising:
   the to-be-detected wafer comprising a product wafer and a monitor wafer;
   acquiring a degree of deviation between the first detection apparatus and the second detection apparatus and issuing a prewarning information if the degree of deviation is less than a degree of deviation threshold comprises:

based on the monitor wafer, performing the degree of deviation detection on the first detection apparatus and the second detection apparatus, so as to acquire a first degree of deviation between the first detection apparatus and the second detection apparatus;

if the first degree of deviation is less than a first degree of deviation threshold, based on the product wafer, performing the degree of deviation detection on the first detection apparatus and the second detection apparatus, so as to acquire a second degree of deviation between the first detection apparatus and the second detection apparatus; and issuing a prewarning information if the second degree of deviation is less than a second degree of deviation threshold.

7. The prewarning method of the apparatus according to claim 6, wherein the performing the degree of deviation detection on the first detection apparatus and the second detection apparatus comprises:

performing the degree of deviation detection at a preset time interval or in real time.

8. The prewarning method of the apparatus according to claim 4, comprising:

writing the prewarning method of the apparatus in a test program, so as to perform the degree of deviation detection when the first detection apparatus and the second detection apparatus are running; and after issuing the prewarning information, further comprising: the first detection apparatus and the second detection apparatus stopping the measurement.

9. An apparatus match detection system for detecting a degree of deviation between apparatuses, comprising:

a first acquisition module for acquiring a first detection result, the first detection result being a result of measuring a critical dimension of a first target detection area of a to-be-detected wafer by a first detection apparatus;

a second acquisition module for acquiring a second detection result, the second detection result being a result of measuring a critical dimension of a second target detection area of the to-be-detected wafer by the first detection apparatus;

a third acquisition module for acquiring a third detection result, the third detection result being a result of measuring a critical dimension of a third target detection area of the to-be-detected wafer by a second detection apparatus;

a first processing module connected to the first detection module, the second detection module, and the third detection module, the first processing module acquiring a measurement difference between the first detection apparatus and the second detection apparatus based on the first detection result; and a second processing module connected to the first processing module, the second processing module acquiring a degree of deviation between the second detection apparatus and the first detection apparatus based on the measurement difference.

10. A prewarning system of an apparatus for detecting a degree of deviation between apparatuses, comprising the apparatus match detection system for detecting a degree of deviation between apparatuses according to claim 9, and further comprising:

a third processing module connected to the second processing module, the third processing module being configured to judge whether the degree of deviation meets a degree of deviation threshold, and issue a control signal if the degree of deviation is less than the degree of deviation threshold; and a prewarning module connected to the third processing module, the prewarning module issuing a prewarning information based on the control signal.

* * * * *